(12) United States Patent
Imoto et al.

(10) Patent No.: US 8,546,892 B2
(45) Date of Patent: Oct. 1, 2013

(54) SEMICONDUCTOR DEVICE AND METHOD FOR MANUFACTURING SEMICONDUCTOR DEVICE

(75) Inventors: Yuki Imoto, Kanagawa (JP); Tetsunori Maruyama, Kanagawa (JP); Takatsugu Omata, Kanagawa (JP); Yusuke Nonaka, Kanagawa (JP); Tatsuya Honda, Kanagawa (JP); Akiharu Miyanaga, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/274,512

(22) Filed: Oct. 17, 2011

(65) Prior Publication Data

US 2012/0097942 A1    Apr. 26, 2012

(30) Foreign Application Priority Data

Oct. 20, 2010  (JP) ................. 2010-235534

(51) Int. Cl.
   *H01L 21/70*   (2006.01)
(52) U.S. Cl.
   USPC ........ 257/407; 257/43; 257/57; 257/E21.159; 257/E21.195; 438/85; 438/104; 438/157; 438/592
(58) Field of Classification Search
   USPC ............... 257/49, 57, 66, 69, 288, 368, 391, 257/392, 402, 405, 407, E29.151, E29.15, 257/E29.158, E29.16, E21.533, E21.535, 257/E21.621, E21.623, 43, E21.15, E21.195, 257/E21.205, E29.293, E29.294; 438/85, 438/104, 608, 151, 157, 197, 585, 592
   See application file for complete search history.

(56) References Cited

U.S. PATENT DOCUMENTS

| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Eduardo A Rodela
(74) *Attorney, Agent, or Firm* — Fish & Richardson P.C.

(57) ABSTRACT

It is an object of an embodiment of the present invention to reduce leakage current between a source and a drain in a transistor including an oxide semiconductor. As a first gate film in contact with a gate insulating film, a compound conductor which includes indium and nitrogen and whose band gap is less than 2.8 eV is used. Since this compound conductor has a work function of greater than or equal to 5 eV, preferably greater than or equal to 5.5 eV, the electron concentration in an oxide semiconductor film can be maintained extremely low. As a result, the leakage current between the source and the drain is reduced.

26 Claims, 10 Drawing Sheets

(56) References Cited

U.S. PATENT DOCUMENTS

| | | | |
|---|---|---|---|
| 6,563,174 B2 | 5/2003 | Kawasaki et al. | |
| 6,667,537 B1 * | 12/2003 | Koike et al. | 257/536 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,859,187 B2 | 12/2010 | Yamazaki et al. | |
| 7,964,918 B2 | 6/2011 | Kanegae et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0039670 A1 | 2/2005 | Hosono et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0102907 A1 * | 5/2006 | Lee et al. | 257/72 |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0127551 A1 | 5/2009 | Imai | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0267087 A1 * | 10/2009 | Yang et al. | 257/88 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0084655 A1 * | 4/2010 | Iwasaki et al. | 257/43 |
| 2010/0092800 A1 | 4/2010 | Itagaki et al. | |
| 2010/0109002 A1 | 5/2010 | Itagaki et al. | |
| 2010/0109058 A1 | 5/2010 | Sakata et al. | |
| 2010/0140609 A1 * | 6/2010 | Yano et al. | 257/43 |
| 2011/0068335 A1 | 3/2011 | Yamazaki et al. | |
| 2011/0215317 A1 | 9/2011 | Yamazaki et al. | |
| 2012/0074407 A1 | 3/2012 | Yamazaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| WO | 2004/114391 A1 | 12/2004 |
| WO | 2011/099335 A1 | 8/2011 |
| WO | 2011099335 A1 | 8/2011 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size Amoled." AM-FPD '08 Digest of Technical Papers, Jul. 2, 2008, pp. 275-278.

Park. S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In-Ga-Zn-Oxide TFTS," IDW '09 : Proceedings of the 16TH International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15TH International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al. "Field-Effect Transitor on SrTiO3 With Sputtered Al2O3 Gate Insulator," Appl. Phys. Lett. (Applied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Po-Tsun Liu et al.; "Nitrogenated amorphous InGaZnO thin film transistor"; Applied Physics Letters, Jan. 31, 2011; pp. 052102-1 to 052102-3; vol. 98, No. 5.

Okamura, K. et al., "Carrier transport in nanocrystalline field-effect transistors: Impact of interface roughness and geometrical carrier trap," Appl. Phys. Lett. (Applied Physics Letters), 2010, vol. 97, No. 15, pp. 153114-1-153114-3, in English.

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000°C," Journal of Solid State Chemistry, 1985, vol. 60, pp. 382-384.

Kimizuka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transitors," Jpn. J. Appl. Phys. (Japanese Journal of Applied Physics) ,2006, vol. 45, No. 5B, pp. 4303-4308.

Nomura, K et al., "Room-Temperature Fabrication of Transparent Flexible Thin-Film Transitors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40. pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In-Ga-Zn-Oxide TFTS With a Novel Passivation Layer," SID Digest '09 : SID International Symposium Digest of Technical Papers, May 31, 2009, pp. 284-287.

* cited by examiner

SEMICONDUCTOR DEVICE AND METHOD FOR MANUFACTURING SEMICONDUCTOR DEVICE

BACKGROUND OF THE INVENTION

1. Field of the Invention

The present invention relates to a semiconductor device and a method for manufacturing the semiconductor device.

In this specification, a semiconductor device means a general device which can function by utilizing semiconductor characteristics, and an electrooptic device, a semiconductor circuit, and an electronic device are all semiconductor devices.

2. Description of the Related Art

A technique by which transistors are formed using semiconductor thin films formed over a substrate having an insulating surface has been attracting attention. Such transistors are applied to a wide range of electronic devices such as an integrated circuit (IC) and an image display device (display device). As semiconductor thin films applicable to the transistors, silicon-based semiconductor materials have been widely used, but oxide semiconductors have been attracting attention as alternative materials.

For example, a transistor whose active layer uses an amorphous oxide including indium (In), gallium (Ga), and zinc (Zn) and having an electron carrier concentration of lower than $10^{18}/cm^3$ is disclosed (see Patent Document 1).

A transistor including an oxide semiconductor can operate at higher speed than a transistor including amorphous silicon and can be manufactured more easily than a transistor including polycrystalline silicon; however, even when the gate potential is the same as the source potential (that is, a state where the gate voltage is 0 V), current (leakage current) flows between the source and the drain (so-called normally on).

[Reference]

[Patent Document 1] Japanese Published Patent Application No. 2006-165528

SUMMARY OF THE INVENTION

An embodiment of the present invention is to provide a semiconductor device which includes a transistor in which even at a gate voltage of 0 V, a current per unit channel flowing between a source and a drain is less than or equal to $1\times10^{-13}$ A/square, preferably less than or equal to $1\times10^{-14}$ A/square or has characteristics similar to those of the transistor and a method for manufacturing the semiconductor device. Note that a current per unit channel means a value in which a current value is multiplied by the ratio of a channel length to a channel width (channel length/channel width) of a transistor, and it is convenient when characteristics are compared between transistors having different channel lengths or different channel widths from each other.

Further, it is an object of an embodiment of the present invention to provide a semiconductor device having a novel structure or a manufacturing method thereof. In particular, it is an object to provide a semiconductor device with low power consumption or high reliability or a manufacturing method thereof.

An embodiment of the present invention is a semiconductor device including an oxide semiconductor film including indium; a film of a compound conductor including indium and nitrogen, whose band gap is less than 2.8 eV, preferably less than 2.3 eV; and an insulating film provided therebetween.

An embodiment of the present invention is a method for manufacturing a semiconductor device, including the steps of: providing an insulating film which including indium and nitrogen and is in contact with a film of a compound conductor whose band gap is less than 2.8 eV, preferably less than 2.3 eV; and providing an oxide semiconductor film including indium over the insulating film.

An embodiment of the present invention is a method for manufacturing a semiconductor device, comprising the steps of: providing an insulating film over an oxide semiconductor film including indium; and providing a film of a compound conductor whose band gap is less than 2.8 eV, preferably less than 2.3 eV, which includes indium and nitrogen and which is in contact with the insulating film.

In the above, work function of the compound conductor is preferably greater than or equal to 5 eV, preferably greater than or equal to 5.5 eV. In the above, the film of the compound conductor may be formed by a sputtering method in an atmosphere including nitrogen. In the above, the film of the compound conductor may be formed by a sputtering method in an atmosphere in which the oxygen concentration is lower than or equal to 5%. In the above, ionization potential of the compound conductor is preferably greater than or equal to 7 eV, more preferably greater than or equal to 7.5 eV.

In the above compound conductor, the percentage of nitrogen may be greater than or equal to 10 at. % and less than or equal to 50 at. % and the percentage of indium may be greater than or equal to 10 at. % and less than or equal to 50 at. % in the all constituent elements. The film of the compound conductor may further include gallium, zinc, or oxygen. The total for the content ratio of these constituent elements does not exceed 100 at. %.

Note that the concentrations fall within the above ranges in the case where measurement is performed using Rutherford backscattering spectrometry, hydrogen forward scattering, or secondary ion mass spectrometry.

Further, in the above, the concentration of donors or acceptors in the oxide semiconductor film is preferably lower than or equal to $1\times10^{12}$ cm$^{-3}$. Here, a donor or an acceptor means an ionized atom by releasing an electron or a hole, an atom which is not ionized is not included even in the case of the same element. For example, the concentration of an atom which can release an electron or a hole in the semiconductor film is $1\times10^{18}$ cm$^{-3}$, and when 0.01% thereof is ionized and releases an electron, the donor concentration is $1\times10^{14}$ cm$^{-3}$, which is 0.01% of $1\times10^{18}$ cm$^{-3}$.

Since it is difficult to separately manufacture an N-type semiconductor and a P-type semiconductor by doping in an oxide semiconductor, unlike a silicon semiconductor, a PN junction cannot be formed as in a silicon semiconductor. Therefore, for a transistor including an oxide semiconductor, a conductor-semiconductor junction (also referred to as a metal-semiconductor junction) in which a conductive material such as a metal is bonded to a semiconductor film is used. In particular, in a source electrode or a drain electrode, a conductor-semiconductor junction so as to be an ohmic junction is used.

In the case of a PN junction, resistance is large in a reverse direction and in the case of a conductor-semiconductor junction which is to be an ohmic junction, resistance is not large, and when the carrier concentration in the semiconductor film is high, a large amount of current flows between a source and a drain even at a gate voltage of 0 V. Therefore, it can be considered that leakage current is reduced by extremely lowering the concentration of donors or acceptors in the semiconductor film.

In an oxide semiconductor whose band gap is 3.2 eV, the concentration of carriers generated by thermal excitation at room temperature is $1\times10^{-7}$ cm$^{-3}$, which is lower than the concentration of carriers in a silicon semiconductor (whose band gap is 1.1 eV), $1\times10^{11}$ cm$^{-3}$.

However, even in the case where the concentration of donors or acceptors in a semiconductor film is sufficiently low, when a source electrode or a drain electrode is formed using the above-described conductor-semiconductor junction, by injection of electrons from a conductor to a semiconductor, a certain amount of electrons exists in the semiconductor film, which becomes a factor in a loss of the insulating property between the source and the drain. In order to eliminate such an electron, a material having a high work function needs to be used for a gate of a transistor. In particular, in order to solve the above problem, a material whose work function is greater than or equal to 5 eV, preferably greater than or equal to 5.5 eV needs to be used.

More strictly, it is preferable to use a material whose work function is higher than the electron affinity of the semiconductor film by 0.7 eV or more. The threshold voltage of a transistor is calculated from the work function of a gate and the electron affinity of a semiconductor film, when a gate insulating film is eternally thin. For example, when the electron affinity of the semiconductor film is 4.6 eV and the work function of the gate is 5.5 eV, the threshold voltage of the transistor is +0.9 V, and when the work function of the gate is 4.3 eV, the threshold voltage of the transistor is −0.3 V.

Needless to say, in the case where the thickness of the gate insulating film has a finite value, the threshold voltage of the transistor is affected by the gate insulating film, and in a transistor including the gate insulating film having greater than or equal to 100 nm at a silicon oxide equivalent thickness, the contribution of the work function of a gate becomes small in determining the threshold voltage. On the other hand, in a transistor whose channel length is less than or equal to 100 nm, the effective thickness of the gate insulating film is required to be extremely small (a silicon oxide equivalent thickness is less than or equal to 10 nm); therefore, the above calculation is appropriate.

In other words, in a transistor whose channel length is sufficiently large and which includes a gate insulating film having greater than or equal to 100 nm at a silicon oxide equivalent thickness, the work function of a gate is not so important; however, in the above transistor whose channel length is less than or equal to 100 nm and which includes a gate insulating film having an effective silicon oxide equivalent thickness of less than or equal to 10 nm, the work function of a gate becomes an important factor in determining transistor characteristics.

Note that the threshold voltage is preferably +0.7 V or more in order that at a gate voltage of 0 V, a current per unit channel between a source and a drain is less than or equal to $1\times10^{-13}$ A/square. In a similar manner, the threshold voltage is preferably +0.8 V or more in order that at a gate voltage of 0 V, a drain current per unit channel is less than or equal to $1\times10^{-14}$ A/square.

However, such a material having a high work function is as expensive as a platinum-based noble metal and its reserves are few; thus, there is a big obstacle to industrial use. In searching a material having a high work function which replaces a platinum-based noble metal, the present inventor found that at least one of the compound conductors described above has a band structure illustrated in FIG. 8A and has a work function greater than or equal to 5 eV, preferably greater than or equal to 5.5 eV.

In other words, it was confirmed by ultra-violet photoelectron spectroscopy that these materials have an ionization potential ($I_p$, an energy gap between a valence band $E_c$ and a vacuum level Evac) of 7 eV or more, typically about 7.8 eV. Further, a band gap ($E_g$) obtained by transmissivity measurement was less than 2.8 eV. Since carriers of a semiconductor are N-type and the carrier concentration is higher than or equal to $1\times10^{18}$ cm$^{-3}$, the Fermi level is around the conduction band ($E_c$).

Accordingly, the work function (W) can be regarded as the same as the electron affinity (x). Therefore, as illustrated in FIG. 8A, the work function is calculated by subtracting the band gap ($E_g$) from the ionization potential ($I_p$) and is found to be 5 eV or more.

Further, as the ratio of nitrogen in a film of a compound conductor is higher, the band gap becomes lower, and on the other hand, the ionization potential hardly fluctuates. Therefore, as the ratio of nitrogen is higher, the work function becomes larger.

FIG. 8B shows a relation between an atmosphere in forming a film of a compound conductor by a sputtering method and a band gap of a film to be obtained. A solid line and a white circle in FIG. 8B are obtained in the case of an atmosphere containing argon and nitrogen and show that as the flow rate of nitrogen in film formation is larger, the band gap tends to be decreased.

On the other hand, a dashed line and a triangle in FIG. 8B are obtained in the case of an atmosphere containing oxygen and nitrogen. When the oxygen concentration in the atmosphere is 25%, the band gap is 3 eV or more, typically about 3.3 eV. Therefore, the work function is lowered to about 4.5 eV.

A transistor in which such a film of a compound conductor serves as a gate is formed, so that a characteristic that a current per unit channel between a source and a drain is less than or equal to $1\times10^{-14}$ A/square can be obtained, even when the gate voltage is 0 V as illustrated in FIG. 9.

FIG. 9 shows a relation between a gate voltage ($V_g$) and a current between a source and a drain ($I_d$) of a transistor (having a channel length of 2.9 μm, a channel width of 10.1 μm, and a gate insulating film (with a relative permittivity of 4.1) of 30 nm), characteristics of a transistor in which the above compound conductor (having a work function of 5 eV) is used as a gate electrode (a curved line referred to as "A") are shifted to a plus side by about 0.3 V as compared to characteristics of a transistor in which general tantalum nitride (having a work function of 4.6 eV) is used as a gate electrode (a curved line referred to as "B"), and the current between the source and the drain at a gate voltage of 0 V is less than or equal to the lower limit of measurement ($1\times10^{-14}$ A).

The above description relates to characteristics of a transistor; however, it is not limited to a transistor, and in a semiconductor device (e.g., a diode) having a stacked structure of a semiconductor film, an insulating film, and a conductive film, a similar effect can be obtained. As described above, according to one embodiment of the present invention, a semiconductor device such as a transistor or a diode, which has excellent electrical characteristics, can be provided.

DETAILED DESCRIPTION OF THE INVENTION

Figure 1A:
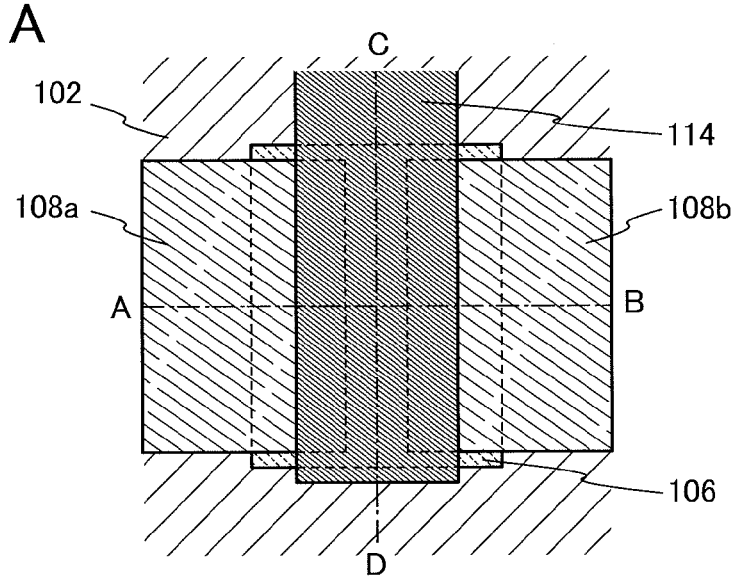
FIGS. 1A to 1C are a top view and cross-sectional views illustrating an example of a semiconductor device according to one embodiment of the present invention.

Hereinafter, embodiments of the present invention will be described in detail with reference to the accompanying drawings. However, the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

An oxide in this specification is an oxide in which the percentage of nitrogen, oxygen, fluorine, sulfur, selenium, chlorine, bromine, tellurium, and iodine (in a molar ratio) contained in a substance (including a compound) is higher than or equal to 25% of the total and the percentage of oxygen to the above elements (in a molar ratio) is higher than or equal to 70%.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

Further, in this specification, "one metal element is a main metal element" indicates the case where among a plurality of metal elements in a substance, the composition of the metal element is greater than or equal to 50% of the metal elements. In addition, "n metal elements $M_1, M_2, \ldots,$ and $M_n$ are main metal elements" indicates the case where the sum of compositions of the metal elements $M_1, M_2, \ldots,$ and $M_n$ is higher than or equal to $\{(1-2^{-n}) \times 100\}[\%]$ of the metal elements.

Note that the concentration of an element which is not a main component in a film denoted in this specification is a minimum value of a concentration detected by secondary ion mass spectrometry unless otherwise specified. In general, when the concentration of an element in a depth direction of a single-layer or multilayer film is measured by secondary ion mass spectrometry, in particular in the case of a small amount of an element, the concentration of the element tends to be unusually high at an interface between the substrate and the film or between the films; however, the concentration in such a portion is not an accurate value and measurement variations are large.

In this manner, the concentration in the vicinity of an interface with low reliability is prevented from being employed and the concentration in a portion which has a stable concentration is used as an index for the accurate concentration in a film; therefore, definition is made as described above in this specification.

Furthermore, the methods and structures described in one of the following embodiments can be combined as appropriate with any of the methods and structures described in the other embodiments.

(Embodiment 1)

In this embodiment, one embodiment of a semiconductor device and a method for manufacturing the semiconductor device will be described with reference to FIGS. 1A to 1C, FIGS. 2A and 2B, and FIGS. 3A to 3E.

Figure 1B:
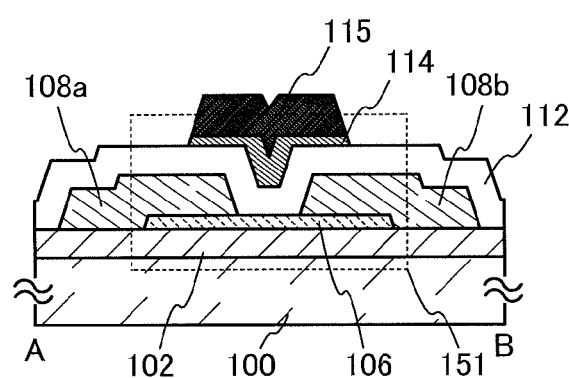
Figure 1C:
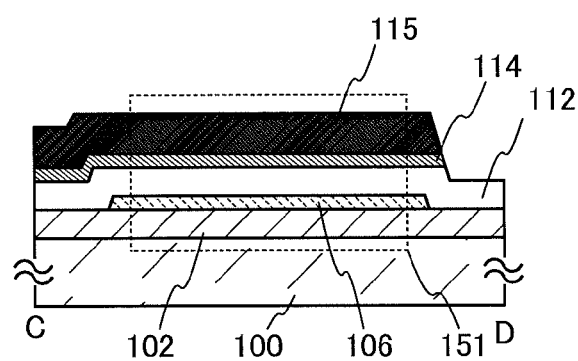

FIGS. 1A to 1C are a top view and cross-sectional views of a transistor 151 which is a top-gate top-contact type as an example of a semiconductor device according to one embodiment of the present invention. Here, FIG. 1A is a top view, FIG. 1B is a cross-sectional view along A-B of FIG. 1A, and FIG. 1C is a cross-sectional view along C-D of FIG. 1A. Note that in FIG. 1A, some of components of the transistor 151 (for example, a gate insulating film 112) are omitted for brevity.

The transistor 151 in FIGS. 1A to 1C includes an insulating film 102, an oxide semiconductor film 106, a source electrode 108a, a drain electrode 108b, the gate insulating film 112, a first gate film 114, and a second gate film 115 over a substrate 100. One or both of the first gate film 114 and the second gate film 115 function as a gate electrode.

The first gate film 114 is in contact with the gate insulating film 112 and is formed using a compound conductor which includes indium and nitrogen and whose band gap is lower than 2.8 eV, preferably lower than 2.3 eV, and the thickness thereof is greater than or equal to 5 nm and less than or equal to 200 nm.

The above compound conductor has less conductivity than a metal; therefore, the second gate film 115 may be provided using a metal, a metal nitride, or the like with preferable conductivity over the first gate film 114. Needless to say, when sufficient conductivity can be obtained with the first gate film 114, the second gate film 115 is not necessarily provided.

When the thickness of the first gate film 114 is less than 5 nm, characteristics of a transistor is affected not by the work function of the above compound conductor but by the work function of the second gate film 115; therefore, it is not preferable that the thickness of the first gate film 114 be less than 5 nm.

As a material of the insulating film 102, silicon oxide, silicon oxynitride, aluminum oxide, a mixed material of any of them, or the like may be used. Alternatively, the insulating film 102 may be formed using a stacked layer of the above material and silicon oxide, silicon nitride, silicon oxynitride, silicon nitride oxide, aluminum oxide, aluminum nitride, a mixed material of any of them, or the like.

For example, when the insulating film 102 has a stacked structure of a silicon nitride film and a silicon oxide film, entry of moisture and hydrogen from the substrate 100 or the like into the transistor 151 can be prevented. In the case where the insulating film 102 is formed to have a stacked-layer structure, an oxide film of silicon oxide, silicon oxynitride, aluminum oxide, a mixed material of any of them, or the like is preferably formed on a side where the insulating film 102 is in contact with the oxide semiconductor film 106.

Note that the insulating film 102 functions as a base film of the transistor 151. The insulating film 102 is preferably an insulating film from which oxygen can be released by heating. "Being possible to release oxygen by heating" means that the released amount of $O_2$ is greater than or equal to $1 \times 10^{18}$ atoms/cm$^3$, preferably greater than or equal to $3 \times 10^{20}$ atoms/cm$^3$.

A material of the oxide semiconductor film 106 preferably has a band gap greater than or equal to 2.8 eV. Further, the electron affinity is preferably greater than or equal to 3.9 eV and less than or equal to 4.9 eV.

As described above, as the work function of the gate and the electron affinity of the semiconductor film are larger, the threshold voltage becomes larger and the current between the source and the drain can be reduced at a gate voltage of 0V. On the other hand, when the electron affinity of the semiconductor film becomes smaller, a material having a work function smaller than the electron affinity of the semiconductor film is preferable in order to form an ohmic junction with the semiconductor film; therefore, a material which can form an ohmic junction at a source or a drain is limited. Accordingly, it is preferable that the electron affinity of the semiconductor film be in the above range for practical use.

Note that a material used for the oxide semiconductor film 106 preferably contains at least indium (In) or zinc (Zn). In particular, In and Zn are preferably contained. As a stabilizer for reducing variation in electrical characteristics of a transistor using the oxide, gallium (Ga) is preferably additionally contained. Tin (Sn) is preferably contained as a stabilizer. Hafnium (Hf) is preferably contained as a stabilizer. Aluminum (Al) is preferably contained as a stabilizer. Titanium (Ti) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As an oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, an In—Ti—Zn-based oxide, an In—Zr—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main metal components, in which there is no particular limitation on the ratio of In:Ga:Zn. The In—Ga—Zn-based oxide may contain a metal element other than the In, Ga, and Zn.

Alternatively, a material represented by $InMO_3(ZnO)_m$, (m>0, and m is not an integer) may be used as the oxide semiconductor. Note that M represents one or more metal elements selected from Ga, Fe, Mn, and Co. Further alternatively, as the oxide semiconductor, a material represented by $In_2SnO_5(ZnO)_n$, (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier concentration, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with an average surface roughness ($R_a$) of less than or equal to 1 nm, preferably less than or equal to 0.3 nm, more preferably less than or equal to 0.1 nm.

Note that, $R_a$ is obtained by three-dimension expansion of center line average roughness that is defined by JIS B 0601 so as to be applied to a plane. The $R_a$ can be expressed as an "average value of the absolute values of deviations from a reference surface to a specific surface" and is defined by the formula below.

$$Ra = \frac{1}{S_0} \int_{y_2}^{y_1} \int_{x_2}^{x_1} |f(x, y) - Z_0| dx dy \quad \text{[FORMULA 1]}$$

In the above formula, $S_0$ represents an area of a plane to be measured (a rectangular region which is defined by four points represented by coordinates $(x_1, y_1)$, $(x_1, y_2)$, $(x_2, Y_1)$, and $(x_2, y_2)$), and $Z_0$ represents an average height of the plane to be measured. $R_a$ can be measured using an atomic force microscope (AFM).

In this embodiment, an In—Ga—Zn-based oxide is used as the oxide semiconductor. In other words, the oxide semiconductor is formed by a sputtering method using an In—Ga—Zn-based oxide as a target.

When the oxide semiconductor film 106 and the insulating film 102 which is a base are in contact with each other, an interface state between the insulating film 102 and the oxide semiconductor film 106 and oxygen deficiency in the oxide semiconductor film 106 can be reduced. By the above reduction of the interface state, the fluctuation in threshold voltage when a high voltage is applied to the gate electrode can be reduced.

The gate insulating film 112 can have a structure similar to that of the insulating film 102, and is preferably an insulating film from which oxygen can be released by heating. At this time, a material having a high dielectric constant, such as hafnium oxide or aluminum oxide, may be used for the gate insulating film 112 considering the function of the gate insulating film of the transistor. Alternatively, a stacked layer of silicon oxide, silicon oxynitride, or silicon nitride and a material having a high dielectric constant, such as hafnium oxide or aluminum oxide, may be used considering a gate withstand voltage and a state of an interface of the oxide semiconductor and the gate insulating film 112.

A protective insulating film may further be provided over the transistor 151. The protective insulating film can have a structure similar to that of the insulating film 102. In order to electrically connect the source electrode 108a or the drain electrode 108b and a wiring, an opening may be formed in the insulating film 102, the gate insulating film 112, and the like. A second gate electrode may further be provided below the oxide semiconductor film 106. Note that it is not always necessary but preferable that the oxide semiconductor film 106 has an island shape.

Figure 2A:
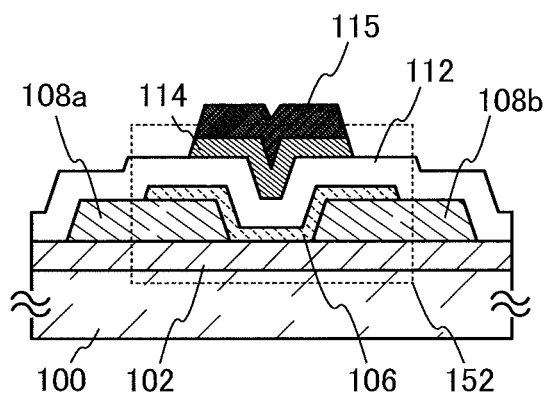
FIGS. 2A and 2B are cross-sectional views each illustrating an example of a semiconductor device according to one embodiment of the present invention.
Figure 2B:
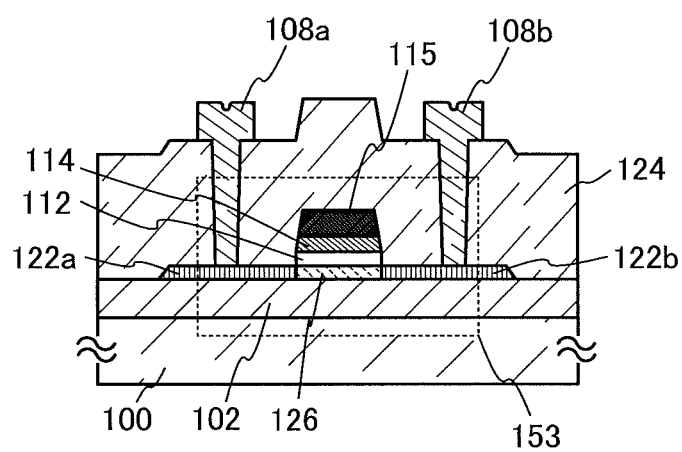

FIGS. 2A and 2B illustrate cross-sectional structures of transistors having different structures from that of the transistor 151. A transistor 152 in FIG. 2A is the same as the transistor 151 in that it includes the insulating film 102, the oxide semiconductor film 106, the source electrode 108a, the drain electrode 108b, the gate insulating film 112, the first gate film 114, and the second gate film 115.

The differences between the transistor 152 and the transistor 151 are the positions where the oxide semiconductor film 106 is connected to the source electrode 108a and the drain electrode 108b. That is, in the transistor 152, the source electrode 108a and the drain electrode 108b are in contact with bottom portions of the oxide semiconductor film 106. The other components are similar to those of the transistor 151 in FIGS. 1A to 1C.

The transistor 153 in FIG. 2B is the same as the transistor 151 and the transistor 152 in that it includes the insulating film 102, the gate insulating film 112, the first gate film 114, the second gate film 115, the source electrode 108a, and the drain electrode 108b.

The transistor 153 is different from the transistor 151 and the transistor 152 in that a channel region 126, a source region 122a, and a drain region 122b are formed in the oxide semiconductor film in the same plane. The source region 122a and the drain region 122b are connected to the source electrode 108a and the drain electrode 108b, respectively, with a protective insulating film 124 interposed therebetween.

The insulating film 102 which is the base can have the same structure as the insulating film 102 of the transistor 151. After the oxide semiconductor film is formed, the gate insulating film 112, the first gate film 114, and the second gate film 115 are formed. The first gate film 114, the second gate film 115, and the gate insulating film 112 can be formed by processing using the same mask. Alternatively, after the first gate film 114 and the second gate film 115 are formed by processing, the gate insulating film 112 may be formed by processing with the use of the first gate film 114 and the second gate film 115 as masks.

In addition, the source region 122a and the drain region 122b are formed in such a manner that the resistance of the oxide semiconductor film is reduced using the first gate film 114 and the second gate film 115 as masks. A region existing under the first gate film 114 becomes the channel region 126.

An example of a manufacturing process of the transistor 151 in FIGS. 1A to 1C will be described below with reference to FIGS. 3A to 3E.

Figure 3A:
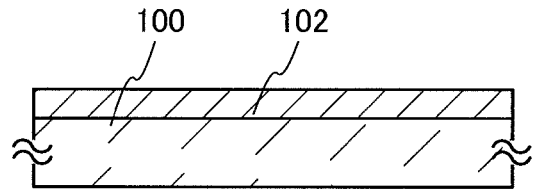
FIGS. 3A to 3E are cross-sectional views illustrating an example of a manufacturing process of a semiconductor device according to one embodiment of the present invention.

First, the insulating film 102 is formed over the substrate 100 (see FIG. 3A). The insulating film 102 is preferably an insulating film from which oxygen can be released by heating.

There is no particular limitation on the property of a material and the like of the substrate 100 as long as the material has heat resistance enough to withstand at least heat treatment to be performed later. For example, a glass substrate, a ceramic substrate, a quartz substrate, a sapphire substrate, or the like can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

In the case where unfavorable impurities for a transistor are included in a substrate, it is preferable that a film formed of an insulating material (e.g., aluminum nitride, aluminum oxide, or silicon nitride) having a function of blocking the impurities be provided on an interface with the substrate 100 or a surface.

As a formation method of the insulating film 102, a plasma CVD method or a sputtering method can be employed, for example. As a material of the insulating film 102, silicon oxide, silicon oxynitride, aluminum oxide, a mixed material of any of them, or the like may be used. Alternatively, the insulating film 102 may be formed using a stacked layer of the above material and silicon oxide, silicon nitride, silicon oxynitride, silicon nitride oxide, aluminum oxide, aluminum nitride, a mixed material of any of them, or the like.

In the case where the insulating film 102 is formed to have a stacked-layer structure, an oxide film of silicon oxide, silicon oxynitride, aluminum oxide, a mixed material of any of them, or the like is preferably formed on a side where the insulating film 102 is in contact with the oxide semiconductor film 106. The total thickness of the insulating film 102 is preferably 10 nm or more.

For example, a silicon oxide film is formed by an RF sputtering method under the following conditions: quartz (preferably synthetic quartz) is used as a target; the substrate temperature is higher than or equal to 30° C. and lower than or equal to 450° C. (preferably higher than or equal to 70° C. and lower than or equal to 200° C.); the distance between the substrate and the target is greater than or equal to 20 mm and less than or equal to 400 mm (preferably greater than or equal to 40 mm and less than or equal to 200 mm); the pressure is higher than or equal to 0.1 Pa and lower than or equal to 4 Pa (preferably higher than or equal to 0.2 Pa and lower than or equal to 1.2 Pa); the high-frequency power is higher than or equal to 0.5 kW and lower than or equal to 12 kW (preferably higher than or equal to 1 kW and lower than or equal to 5 kW); and the proportion of $O_2/(O_2+Ar)$ in the an formation gas is higher than or equal to 1% and lower than or equal to 100% (preferably higher than or equal to 6% and lower than or equal to 100%).

Figure 3B:
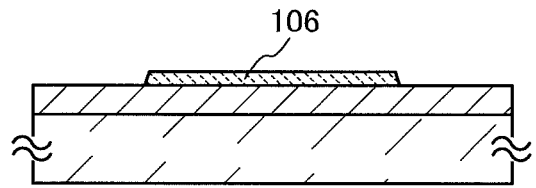

Next, an oxide semiconductor film is formed over the insulating film 102 and then is processed to form the oxide semiconductor film 106 having an island shape (see FIG. 3B). Note that the insulating film 102 and the oxide semiconductor film 106 are preferably formed successively without exposure to the air. For example, the oxide semiconductor film can be formed by a sputtering method, a vacuum evaporation method, a pulsed laser deposition method, a CVD method, or the like. In this embodiment, the oxide semiconductor film is formed by a sputtering method using a target of an In—Ga—Zn-based oxide. The thickness of the oxide semiconductor film is preferably greater than or equal to 3 nm and less than or equal to 50 nm.

As the target of an In—Ga—Zn-based oxide, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used.

The relative density of the oxide target is higher than or equal to 90% and lower than or equal to 100%, preferably higher than or equal to 95% and lower than or equal to 99.9%. This is because, with the use of the oxide target with a high relative density, a dense oxide semiconductor film can be faulted.

The film formation may be performed in a rare gas (typically argon) atmosphere, an oxygen atmosphere, a mixed atmosphere containing a rare gas and oxygen, or the like. Moreover, it is preferably an atmosphere using a high-purity gas in which impurities such as hydrogen, water, a hydroxyl group, and hydride are sufficiently removed so that entry of hydrogen, water, a hydroxyl group, and hydride into the oxide semiconductor film can be prevented.

An example of the film formation conditions is as follows: the distance between the substrate and the target is 60 mm; the pressure is 0.4 Pa; the direct-current (DC) power is 0.5 kW; and the film formation atmosphere is a mixed atmosphere containing argon and oxygen (the proportion of the oxygen flow is 33%). Note that a pulsed DC sputtering method is preferable because powder substances (also referred to as particles or dust) generated in film formation can be reduced and the film thickness can be uniform.

Note that an alkali metal such as lithium, sodium, or potassium or an alkaline earth metal is unfavorable element for the case where an oxide semiconductor is used for a transistor; therefore, it is preferable that an alkali metal or an alkaline earth metal be contained in a material used for forming the transistor as little as possible.

Of alkali metals, in particular, sodium is dispersed in an insulating oxide which is in contact with an oxide semiconductor to be a sodium ion. Alternatively, sodium cuts a bond between a metal element and oxygen or enters the bond in the oxide semiconductor. As a result, transistor characteristics deteriorate (e.g., the transistor becomes normally-on (the shift of a threshold voltage to a negative side) or the mobility is decreased). In addition, this also causes variation in the characteristics.

Such a problem is significant especially in the case where the hydrogen concentration in the oxide semiconductor is extremely low. Therefore, the concentration of an alkali metal is strongly required to be extremely low in the case where the hydrogen concentration in the oxide semiconductor is lower than or equal to $5\times10^{19}$ cm$^{-3}$, particularly lower than or equal to $5\times10^{18}$ cm$^{-3}$.

For example, the concentration of sodium in the oxide semiconductor film 106 may be lower than or equal to $5\times10^{16}$ cm$^{-3}$, preferably lower than or equal to $1\times10^{16}$ cm$^{-3}$, more preferably lower than or equal to $1\times10^{15}$ cm$^3$. Similarly, the concentration of lithium in the oxide semiconductor film 106 may be lower than or equal to $5\times10^{15}$ cm$^{-3}$, preferably lower than or equal to $1\times10^{15}$ cm$^{-3}$; the concentration of potassium in the oxide semiconductor film 106 may be lower than or equal to $5\times10^{15}$ cm$^{-3}$, preferably lower than or equal to $1\times10^{15}$ cm$^{-3}$.

When the substrate temperature is higher than or equal to 100° C. and lower than or equal to 450° C., preferably higher than or equal to 150° C. and lower than or equal to 350° C. at the time of forming the oxide semiconductor film, oxygen is released from the insulating film 102, whereby oxygen deficiency in the oxide semiconductor film and an interface state between the insulating film 102 and the oxide semiconductor film can be reduced.

Note that before the oxide semiconductor film is formed by a sputtering method, a substance attached to a surface where the oxide semiconductor film is to be formed (e.g., a surface of the insulating film 102) may be removed by reverse sputtering in which an argon gas is introduced and plasma is generated.

Here, the reverse sputtering is a method in which ions collide with a surface to be processed so that the surface is modified, in contrast to normal sputtering in which ions collide with a sputtering target. An example of a method for making ions collide with a surface to be processed is a method in which high-frequency voltage is applied to the surface side in an argon atmosphere so that plasma is generated near an object to be processed. Note that an atmosphere of nitrogen, helium, oxygen, or the like may be used instead of an argon atmosphere.

The oxide semiconductor film 106 can be formed in the following manner: a mask having a desired shape is formed over an oxide semiconductor film and the oxide semiconductor film is etched. The mask can be formed by a method such as photolithography. Alternatively, the mask may be formed by an ink-jet method or the like.

For the etching of the oxide semiconductor film, either wet etching or dry etching may be employed. It is needless to say that both of them may be employed in combination.

After that, heat treatment (first heat treatment) is preferably performed on the oxide semiconductor film 106. By the first heat treatment, excessive hydrogen (including water and a hydroxyl group) in the oxide semiconductor film 106 can be removed and a structure of the oxide semiconductor can be ordered. The temperature of the first heat treatment is higher than or equal to 100° C. and lower than or equal to 650° C. or lower than the strain point of the substrate, preferably higher than or equal to 250° C. and lower than or equal to 600° C. The atmosphere of the first heat treatment is an oxidizing gas atmosphere or an inert gas atmosphere.

Note that an inert gas atmosphere is preferably an atmosphere that contains nitrogen or a rare gas as its main component and does not contain water, hydrogen, and the like. For example, the purity of nitrogen or a rare gas such as helium, neon, or argon introduced into a heat treatment apparatus is set to 6N (99.9999%) or more, preferably 7N (99.99999%) or more (i.e., the impurity concentration is 1 ppm or lower, preferably 0.1 ppm or lower). The inert gas atmosphere is an atmosphere that contains an inert gas as its main component and contains a reactive gas of lower than 10 ppm.

Note that the oxidizing gas is oxygen, ozone, nitrogen dioxide, nitrous oxide, or the like, and it is preferable that the oxidizing gas do not contain water, hydrogen, and the like. For example, the purity of oxygen, ozone, nitrogen dioxide, or nitrous oxide introduced into a heat treatment apparatus is set to 6N (99.9999%) or higher, preferably 7N (99.99999%) or higher (i.e., the impurity concentration is 1 ppm or lower, preferably 0.1 ppm or lower). As the oxidizing gas atmosphere, an atmosphere in which an oxidizing gas is mixed with an inert gas may be used, and the oxidizing gas of at least 10 ppm is contained.

By the first heat treatment, oxygen is released from the insulating film 102, whereby the interface state between the insulating film 102 and the oxide semiconductor film 106 and the oxygen deficiency in the oxide semiconductor film 106 can be reduced. By the above reduction of the interface state, the fluctuation in threshold voltage when a high voltage is applied to the gate can be reduced and a highly reliable transistor can be obtained.

Further, in general, it is known that the oxygen deficiency in the oxide semiconductor becomes donors and the source for generating electrons which are carriers. By embedding the oxygen deficiency in the oxide semiconductor film 106, the donor concentration can be reduced.

The heat treatment can be performed in such a manner that, for example, an object to be processed is introduced into an electric furnace in which a resistance heating element or the like is used and heated at 350° C. in a nitrogen atmosphere for an hour. During the heat treatment, the object to be processed is not exposed to the air to prevent the entry of water and hydrogen.

The heat treatment apparatus is not limited to an electric furnace, and may include a device for heating an object to be processed by heat conduction or heat radiation from a medium such as a heated gas. For example, a rapid thermal anneal (RTA) apparatus such as a gas rapid thermal anneal (GRTA) apparatus or a lamp rapid thermal anneal (LRTA) apparatus can be used.

An LRTA apparatus is an apparatus for heating an object to be processed by radiation of light (electromagnetic waves) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high temperature gas. As the high temperature gas, used is an inert gas which does not react with an object to be processed in heat treatment, such as nitrogen or a rare gas like argon.

For example, as the first heat treatment, GRTA treatment may be performed as follows. The object to be processed is put in an inert gas atmosphere that has been heated, heated for several minutes, and then taken out of the inert gas atmosphere. GRTA treatment enables high-temperature heat treatment in a short time. Moreover, GRTA treatment can be employed even when the temperature exceeds the upper temperature limit of the object. Note that the inert gas atmosphere may be switched to an atmosphere containing an oxidizing gas during the treatment.

This is because by performing the first heat treatment in an atmosphere containing the oxidizing gas, oxygen deficiency in the oxide semiconductor film 106 can be embedded and defect levels in an energy gap due to oxygen deficiency can be reduced. Such heat treatment may be performed once or plural times.

Note that the case is described here in which the first heat treatment is performed after processing the oxide semiconductor film into the oxide semiconductor film 106; however, one embodiment of the present invention is not limited thereto. The oxide semiconductor film 106 may be formed in such a manner that the oxide semiconductor film is subjected to the first heat treatment and then etched.

Figure 3C:
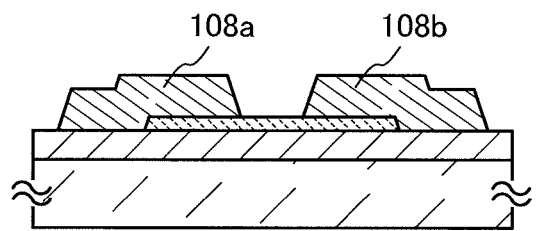

Next, a conductive film is formed over the insulating film 102 and the oxide semiconductor film 106 and processed to form the source electrode 108a, the drain electrode 108b, and other wirings (see FIG. 3C). The channel length L of the transistor depends on the distance between the edges of the source electrode 108a and the drain electrode 108b which are formed here.

As the conductive film used for the source electrode 108a and the drain electrode 108b, for example, a metal film containing an element selected from aluminum, chromium, copper, tantalum, titanium, molybdenum, and tungsten, or a metal nitride film containing any of the above elements as its component (e.g., a titanium nitride film, a molybdenum nitride film, or a tungsten nitride film) can be used. A high-melting-point metal film of titanium, molybdenum, tungsten, or the like or a metal nitride film of any of these elements (a titanium nitride film, a molybdenum nitride film, or a tungsten nitride film) may be stacked on one of or both a bottom side and a top side of a metal film of aluminum, copper, or the like.

Alternatively, the conductive film used for the source electrode 108a and the drain electrode 108b may be formed using a conductive oxide. As the conductive oxide, an indium oxide ($In_2O_3$), a tin oxide ($SnO_2$), a zinc oxide (ZnO), an In—Sn-based oxide ($In_2O_3$—$SnO_2$, which is abbreviated to ITO), an In—Zn-based oxide ($In_2O_3$—ZnO), or any of these oxide materials containing silicon oxide can be used.

Note that in etching of the conductive film, part of the oxide semiconductor film 106 is etched, so that a groove (a recessed portion) is formed in some cases.

After that, by plasma treatment using a gas such as oxygen, ozone, nitrogen dioxide, or nitrous oxide, a surface of an exposed portion of the oxide semiconductor film 106 may be oxidized and oxygen deficiency may be embedded. In the case where plasma treatment is performed, the gate insulating film 112 which is to be in contact with part of the oxide semiconductor film 106 is preferably formed without being exposed to the air, following the plasma treatment.

Figure 3D:
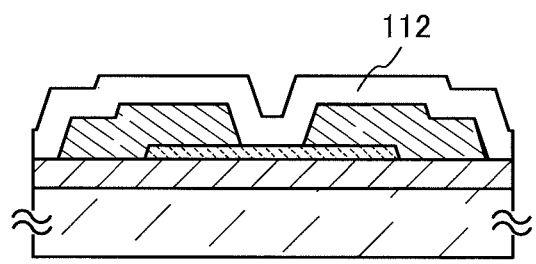

Next, the gate insulating film 112 is formed so as to cover the source electrode 108a and the drain electrode 108b and to be in contact with part of the oxide semiconductor film 106 (see FIG. 3D).

The gate insulating film 112 can have a structure similar to that of the insulating film 102. Note that a material having a high dielectric constant, such as hafnium oxide or aluminum oxide, may be used for the gate insulating film 112 considering the function of the gate insulating film of the transistor. Alternatively, a stacked layer of silicon oxide, silicon oxynitride, or silicon nitride and a material having a high dielectric constant, such as hafnium oxide or aluminum oxide, may be used considering a gate withstand voltage and a state of an interface between the oxide semiconductor and the gate insulating film 112.

The total thickness of the gate insulating film 112 is preferably greater than or equal to 1 nm and less than or equal to 300 nm, more preferably greater than or equal to 5 nm and less than or equal to 50 nm. As the thickness of the gate insulating film is larger, the higher voltage can be applied to a gate but on the other hand, a short channel effect occurs more easily and the threshold voltage tends to shift to a negative direction. In addition, it is found that when the thickness of the gate insulating film is less than or equal to 5 nm, leakage due to a tunnel current is increased.

Second heat treatment is preferably performed after the gate insulating film 112 is formed. The second heat treatment is performed at a temperature of higher than or equal to 250° C. and lower than or equal to 700° C., preferably higher than or equal to 350° C. and lower than or equal to 600° C. Needless to say, the temperature may be changed considering characteristics of a substrate or a deposited material.

The second heat treatment may be performed in an atmosphere of an oxidizing gas or an inert gas. Note that it is preferable that water, hydrogen, and the like be not contained in the atmosphere of an oxidizing gas or an inert gas. Further, the purity of the gas introduced into a heat treatment apparatus is preferably 6N (99.9999%) or higher, more preferably 7N (99.99999%) or higher (that is, the impurity concentration is 1 ppm or lower, preferably 0.1 ppm or lower).

The second heat treatment is performed while the oxide semiconductor film 106 and the gate insulating film 112 are in contact with each other. Thus, oxygen which is one of main components of the oxide semiconductor can be supplied from the gate insulating film 112 containing oxygen to the oxide semiconductor film 106. Accordingly, oxygen deficiency in the oxide semiconductor film 106 and an interface state between the oxide semiconductor film 106 and the gate insulating film 112 can be reduced. At the same time, defects in the gate insulating film 112 can also be reduced.

Note that there is no particular limitation on the timing of the second heat treatment as long as it is after the gate insulating film 112 is formed. For example, the second heat treatment may be performed after the second gate film 115 is formed.

Figure 3E:
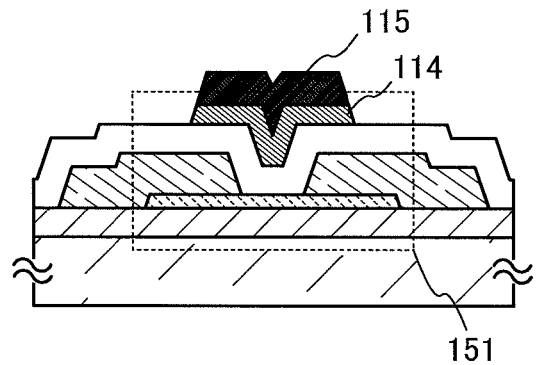

Then, the first gate film 114 and the second gate film 115 are formed (see FIG. 3E). As a material of the first gate film 114, a compound conductor film obtained by sputtering using an In—Ga—Zn-based oxide as a target in an atmosphere containing nitrogen is used. Note that the first gate film 114 and the second gate film 115 can be formed by a vacuum evaporation method, a pulsed laser deposition method, a CVD method, or the like without limitation to a sputtering method.

The thickness of the compound conductor film is preferably greater than or equal to 10 nm and less than or equal to 50 nm. As the target of an In—Ga—Zn-based oxide, an oxide target having a composition ratio of $In_2O_3:Ga_2O_3:ZnO=1:1:1$ [molar ratio] can be used, for example. Note that it is not necessary to limit the material and the composition ratio of the target to the above. For example, an oxide target having a composition ratio of $In_2O_3:Ga_2O_3:ZnO=1:1:2$ [molar ratio] may alternatively be used.

Note that in order to reduce costs of manufacturing facilities, a compound conductor film may be formed as follows: an apparatus and a target which are used for forming the oxide semiconductor film 106 are used and only an atmosphere in film formation is changed.

The relative density of the oxide target is higher than or equal to 90% and lower than or equal to 100%, preferably higher than or equal to 95% and lower than or equal to 99.9%. This is because, with the use of the oxide target with a high relative density, a dense compound conductor film can be formed.

The film formation atmosphere is preferably a mixed atmosphere containing a rare gas (typically argon) and nitrogen or a nitrogen atmosphere with a concentration of 99% or more. The concentration of oxygen in the atmosphere is preferably 5% or lower in order to obtain a compound conductor having a higher work function.

An example of the film formation conditions is as follows: the distance between the substrate and the target is 60 mm; the pressure is 0.4 Pa; the direct-current (DC) power is 0.5 kW; and the film formation atmosphere is a mixed atmosphere containing argon and nitrogen (the proportion of the nitrogen flow is 12.5%).

The second gate film 115 can be formed using a metal material such as molybdenum, titanium, tantalum, tungsten, aluminum, copper, neodymium, or scandium, nitride of any of these metal materials, or an alloy material which contains any of these metal materials as its main component. Note that the second gate film 115 may have a single-layer structure or a stacked-layer structure. These metals are deposited over the compound conductor by a method such as a sputtering method and etched into a desired shape, so that the first gate film 114 and the second gate film 115 are formed. Through the above process, the transistor 151 is formed.

(Embodiment 2)

In this embodiment, an example of a manufacturing process of the transistor 152 in FIG. 2A will be described with reference to FIGS. 4A to 4E.

Figure 4A:
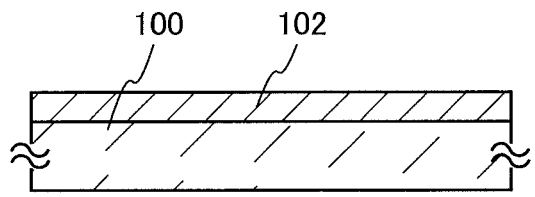
FIGS. 4A to 4E are cross-sectional views illustrating an example of a manufacturing process of a semiconductor device according to one embodiment of the present invention.
Figure 4B:
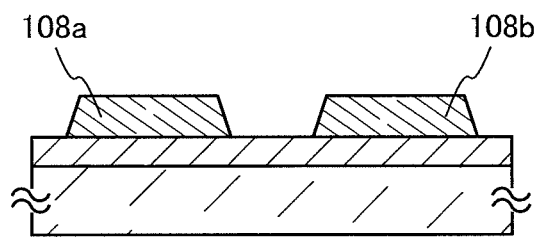

First, the insulating film 102 is formed over the substrate 100 (see FIG. 4A). Next, a conductive film is formed over the insulating film 102 and processed to form the source electrode 108a, the drain electrode 108b, and other wirings (see FIG. 4B).

Figure 4C:
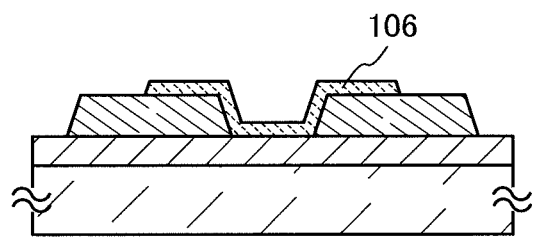

Next, an oxide semiconductor film in contact with the source electrode 108a and the drain electrode 108b is formed over the insulating film 102 and then is processed to form the oxide semiconductor film 106 having an island shape (see FIG. 4C). After that, first heat treatment similar to that performed on the transistor 151 may be performed.

Figure 4D:
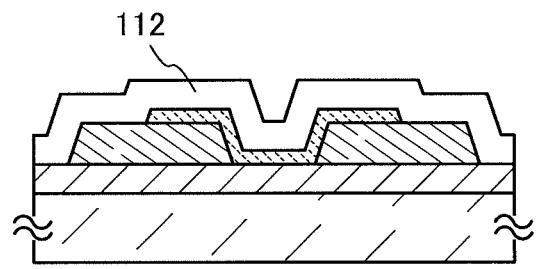

Next, the gate insulating film 112 is formed so as to cover the source electrode 108a and the drain electrode 108b and be in contact with part of the oxide semiconductor film 106 (see FIG. 4D).

Figure 4E:
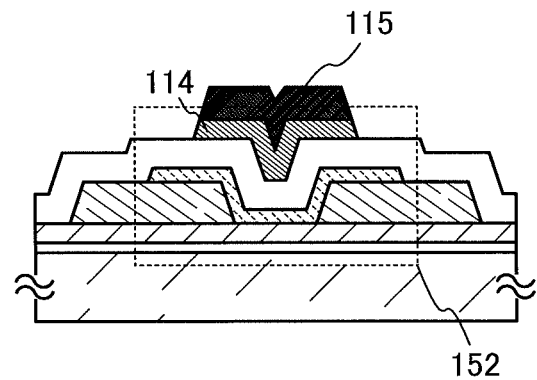

After that, the first gate film 114 and the second gate film 115 are formed (see FIG. 4E). As the first gate film 114, a film formed by a sputtering method using the target of an In—Ga—Zn-based oxide described in Embodiment 1 in an atmosphere containing nitrogen may be used. Through the above process, the transistor 152 is formed.

(Embodiment 3)

In this embodiment, an example of a manufacturing process of the transistor 153 in FIG. 2B will be described with reference to FIGS. 5A to 5E.

Figure 5A:
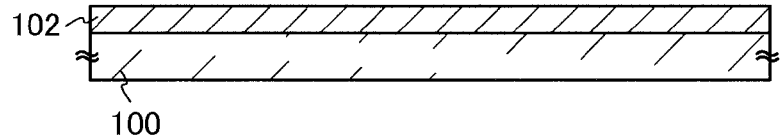
FIGS. 5A to 5E are cross-sectional views illustrating an example of a manufacturing process of a semiconductor device according to one embodiment of the present invention.
Figure 5B:
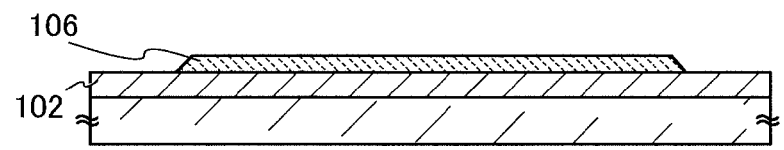

First, the insulating film 102 is formed over the substrate 100 (see FIG. 5A). Next, an oxide semiconductor film is formed over the insulating film 102 and processed to form the oxide semiconductor film 106 having an island shape (see FIG. 5B).

Figure 5C:
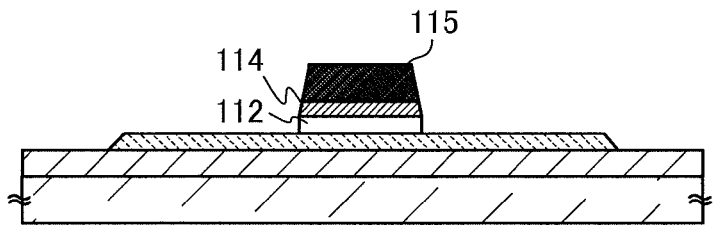
Figure 5D:
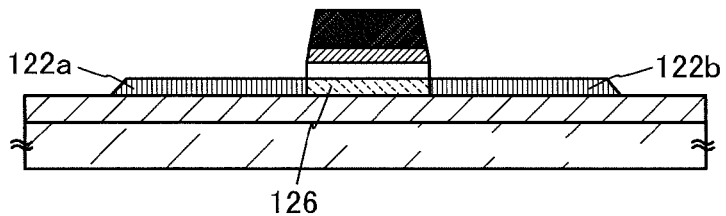
Figure 5E:
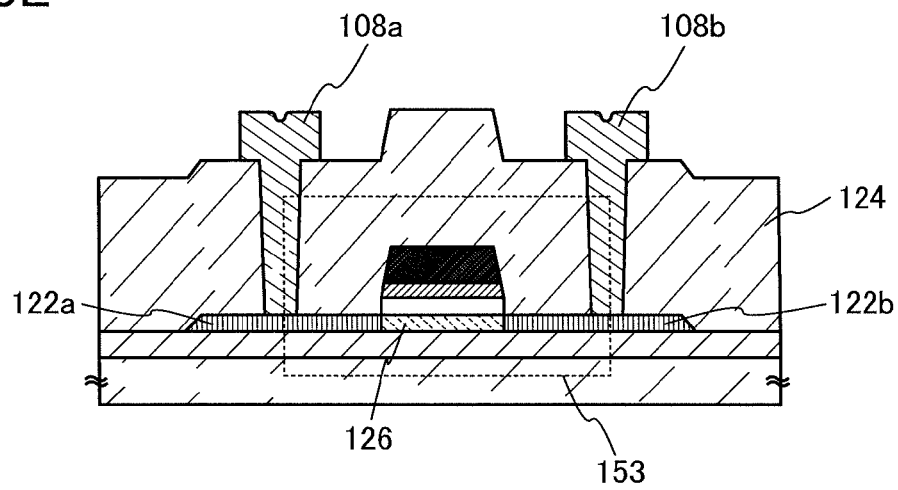

Next, an insulating film to be the gate insulating film 112 and a compound conductor film to be the first gate film 114, and a conductive film to be the second gate film 115 are formed and processed to have similar patterns by photolithography, so that the gate insulating film 112, the first gate film 114, and the second gate film 115 are obtained (see FIG. 5C). The compound conductor film may be formed by a sputtering method using the target of an In—Ga—Zn-based oxide described in Embodiment 1 in an atmosphere containing nitrogen.

Next, the resistance of the oxide semiconductor film 106 is reduced using the first gate film 114 and the second gate film 115 as a mask, so that the source region 122a and the drain region 122b are formed. A region under the first gate film 114 and the second gate film 115 where the resistance is not reduced becomes the channel region 126 (see FIG. 5D). As a method for reducing the resistance, argon plasma treatment, hydrogen plasma treatment, ammonia plasma treatment, ion implantation of phosphorus or boron, and the like can be given.

At this time, the channel length L of the transistor is determined by the width of the first gate film 114 and the second gate film 115. By patterning using the first gate film 114 and the second gate film 115 as the mask in this manner, the source region 122a and the drain region 122b do not overlap with the first gate film 114 and the second gate film 115 and parasitic capacitance is not generated in this region; therefore, the operation speed of the transistor can be increased.

Next, the protective insulating film 124 is formed and an opening is provided in a region of the protective insulating film 124, which is overlapped with the source region 122a and the drain region 122b. A conductive film is formed and processed to form the source electrode 108a, the drain electrode 108b, and other wirings (see FIG. 5E). Through the above process, the transistor 153 is formed.

(Embodiment 4)

FIGS. 6A to 6E are cross-sectional views illustrating a manufacturing process of a display device of this embodiment. A transistor described in this embodiment is a bottom-gate transistor whose gate electrode is located on the substrate side and a top-contact transistor whose source electrode and drain electrode are in contact with a top surface of a semiconductor film.

Figure 6A:
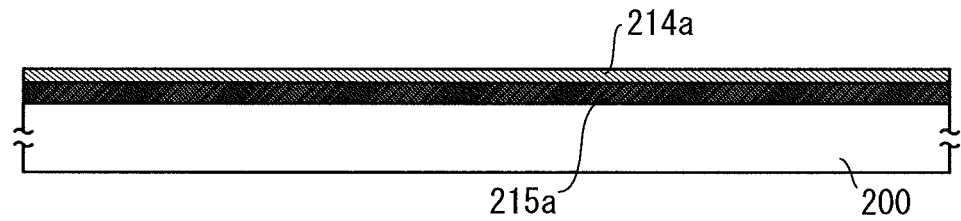
FIGS. 6A to 6E are cross-sectional views illustrating an example of a manufacturing process of a semiconductor device according to one embodiment of the present invention.
Figure 6B:
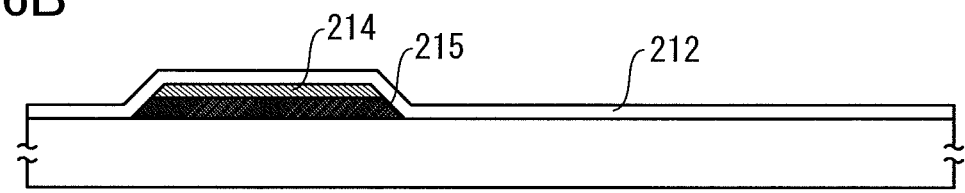

The outline of a manufacturing process will be described below. As illustrated in FIG. 6A, a conductive film 215a to be a second gate film 215 and a compound conductive film 214a to be a first gate film 214 are formed over a substrate 200 having an insulating surface. The thickness of the conductive film 215a is greater than or equal to 100 nm and less than or equal to 400 nm, and for the material thereof, the material used for the second gate film 115 described in Embodiment 1 may be referred to. Further, the thickness of the compound conductive film 214a is greater than or equal to 10 nm and less than or equal to 50 nm, and for the material, the manufacturing method, and the like thereof, those of the first gate film 114 in Embodiment 1 may be referred to.

Next, the conductive film 215a and the compound conductive film 214a are etched to form the second gate film 215 and the first gate film 214, and further, a gate insulating film 212 is formed. For the thickness, the material, the manufacturing method, and the like of the gate insulating film 212, those of the gate insulating film 112 in Embodiment 1 may be referred to (see FIG. 6B).

Figure 6C:
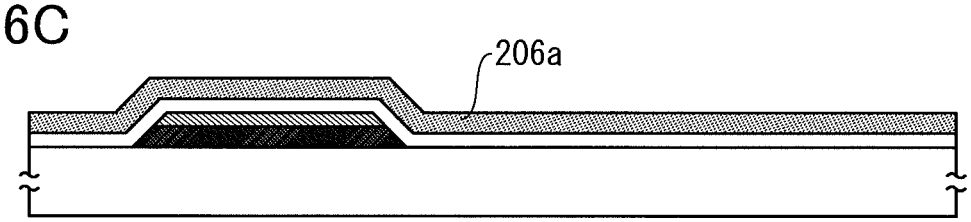
Figure 6D:
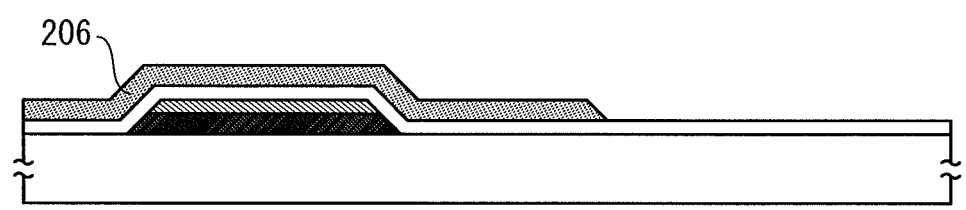
Figure 6E:
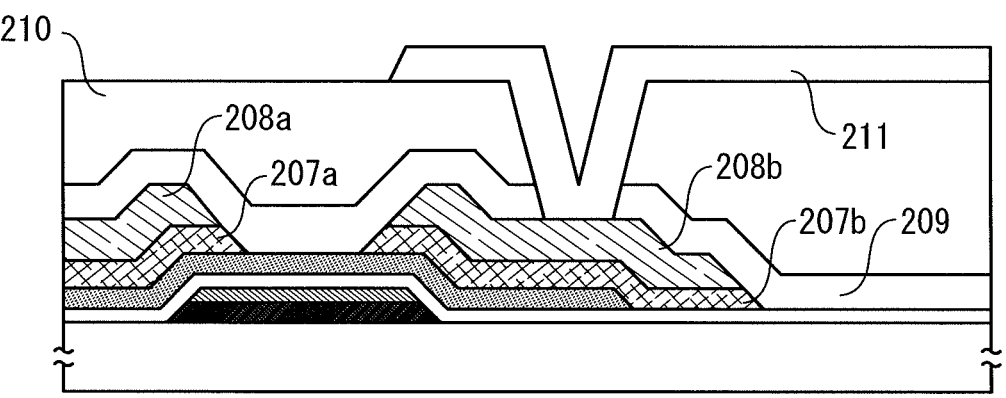

As illustrated in FIG. 6C, an oxide semiconductor film 206a is formed. For the material and the thickness of the oxide semiconductor film 206a, Embodiment 1 may be referred to. Then, as illustrated in FIG. 6D, the oxide semiconductor film 206a is etched, whereby an oxide semiconductor film 206 having a desired shape (e.g., island shape) is obtained. Note that as the etching here, the gate insulating film 212 may be used as an etching stopper. After that, heat treatment (first heat treatment) is preferably performed on the oxide semiconductor film 206. Embodiment 1 may be referred to for the details.

Then, an oxide semiconductor film having N-type conductivity and a conductive film of a metal or the like are deposited. For the formation of these films, a sputtering method may be used. For the N-type oxide semiconductor film, indium oxide, indium tin oxide, zinc oxide, zinc aluminum oxide, or the like may be used. Note that the N-type oxide semiconductor film is provided for reducing contact resistance between a source electrode and a drain electrode and the oxide semiconductor film 206; however, the N-type oxide semiconductor film is not necessarily provided depending on the kinds of metals to be used for the source electrode and the drain electrode.

As the conductive film, for example, a metal film containing an element selected from aluminum, chromium, copper, tantalum, titanium, molybdenum, or tungsten, or a metal nitride film containing any of the above elements as a main metal component (a titanium nitride film, a molybdenum nitride film, or a tungsten nitride film) can be used.

Alternatively, a film of a high-melting-point metal such as titanium, molybdenum, or tungsten or a metal nitride film of any of these elements (a titanium nitride film, a molybdenum nitride film, or a tungsten nitride film) may be fanned over or/and below a metal film of Al, Cu, or the like.

Then, these are processed into desired shapes, and N-type oxide semiconductor films 207a and 207b, a source electrode 208a, and a drain electrode 208b are formed. In the above manner, a basic structure of a transistor is completed. Note that in etching of the conductive film, part of the oxide semiconductor film 206 is etched and a groove (recessed portion) is formed in the oxide semiconductor film 206, in some cases.

After the above etching, plasma treatment may be performed using a gas such as argon, so that water or the like adsorbed to an exposed surface of the oxide semiconductor film 206 may be removed.

Further, a first insulator 209 is formed by a sputtering method, a CVD method, or the like. In the case where the plasma treatment is performed, it is preferable that the first insulator 209 be successively formed without the substrate 200 being taken out to an air atmosphere after the plasma treatment because an atmospheric component (in particular, water) is not adsorbed on the surface of the oxide semiconductor film 206.

The first insulator 209 can be formed typically using an inorganic insulator such as silicon oxide, silicon oxynitride, aluminum oxide, or aluminum oxynitride. In particular, it is preferable to use an oxide because of the reason to be described below, and oxygen that is equivalent to or exceeds the stoichiometric ratio is preferably contained.

Second heat treatment is preferably performed after the first insulator 209 is formed. The second heat treatment is performed at a temperature higher than or equal to 150° C. and lower than or equal to 600° C., preferably higher than or equal to 250° C. and lower than or equal to 450° C.

The second heat treatment may be performed in an atmosphere of nitrogen, oxygen, ultra-dry air (air in which the water content is less than or equal to 20 ppm, preferably less than or equal to 1 ppm, more preferably less than or equal to 10 ppb), or a rare gas (argon, helium, or the like). It is also preferable that the purity of nitrogen, oxygen, or the rare gas which is introduced into a heat treatment apparatus be set to be higher than or equal to 6N, preferably higher than or equal to 7N (that is, the impurity concentration is lower than or equal to 1 ppm, preferably lower than or equal to 0.1 ppm).

In the second heat treatment, the oxide semiconductor film 206 and the first insulator 209 are heated in a state where the oxide semiconductor film 206 is in contact with the first insulator 209. Therefore, oxygen in the oxide semiconductor film 206, which might be reduced due to dehydration treatment or dehydrogenation treatment, for example, the first heat treatment, can be supplied from the first insulator 209. Accordingly, charge trapping centers in the oxide semiconductor film 206 can be decreased.

At least one of the first heat treatment and the second heat treatment is applied, whereby the oxide semiconductor film 206 can be highly purified so as to contain impurities other than main components as little as possible. The highly purified oxide semiconductor film 206 contains extremely few carriers derived from a donor. The carrier concentration can be lower than $1\times10^{14}/cm^3$, preferably lower than $1\times10^{12}/cm^3$, more preferably lower than $1\times10^{11}/cm^3$.

Next, a second insulator 210 which has a flat surface is formed. The second insulator 210 may be formed using any of various organic materials. Then, the first insulator 209 and the second insulator 210 are selectively etched, so that a contact hole reaching the drain electrode 208b is formed. A display electrode 211 which is in contact with the drain electrode 208b through this contact hole is formed (see FIG. 6E).

A light-transmitting material or a reflective material can be used for the display electrode 211. For the light-transmitting material, a conductive semiconductor whose band gap is greater than or equal to 3 eV, such as an In—Sn-based oxide or a Zn—Al-based oxide, can be used. A metal nanowire or a carbon film (graphene or the like) with a thickness of less than or equal to 3 nm can also be used. For the reflective material, a film formed using any of various metal materials (aluminum, silver, and the like) can be used. The surface of a reflective display electrode is preferably provided with an irregular unevenness to display white color.

In this embodiment, the manufacturing process of the display device using a transistor is described; it is apparent that the method disclosed in this embodiment can be applied not only to a display device but also an electronic device of another embodiment (e.g., an integrated circuit).

(Embodiment 5)

Figure 7A:
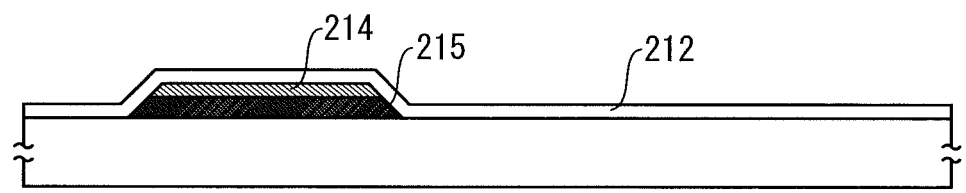
FIGS. 7A to 7C are cross-sectional views illustrating an example of a manufacturing process of a semiconductor device according to one embodiment of the present invention.
Figure 7B:
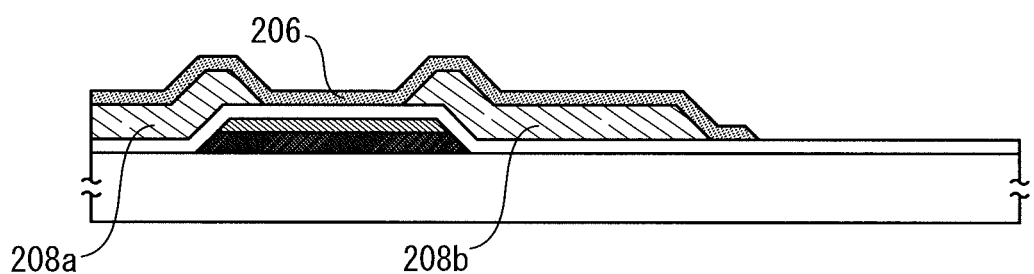
Figure 7C:
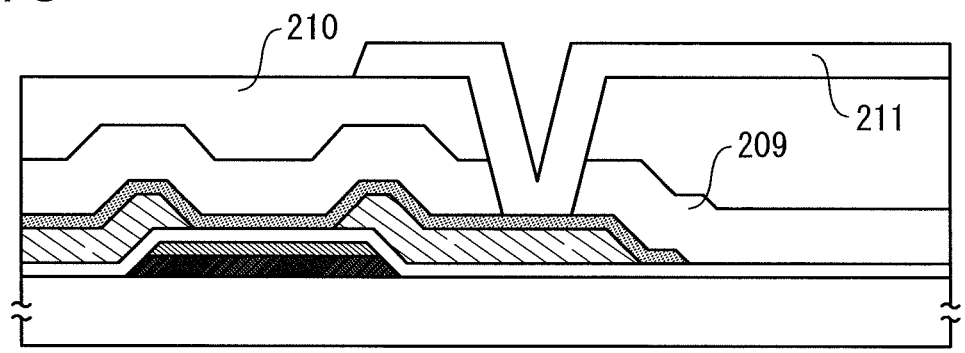
Figure 8A:
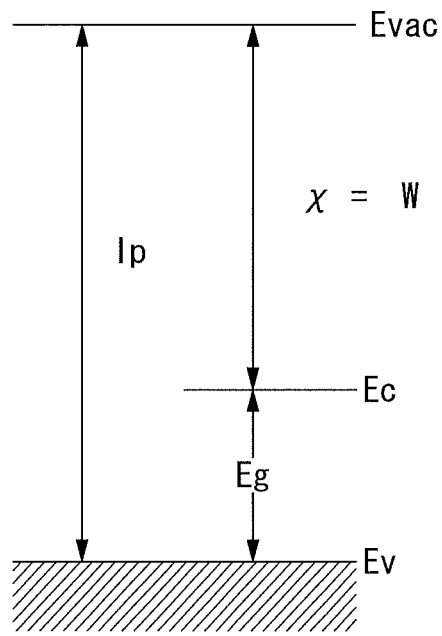
FIGS. 8A and 8B illustrate an effect of one embodiment of the present invention.
Figure 8B:
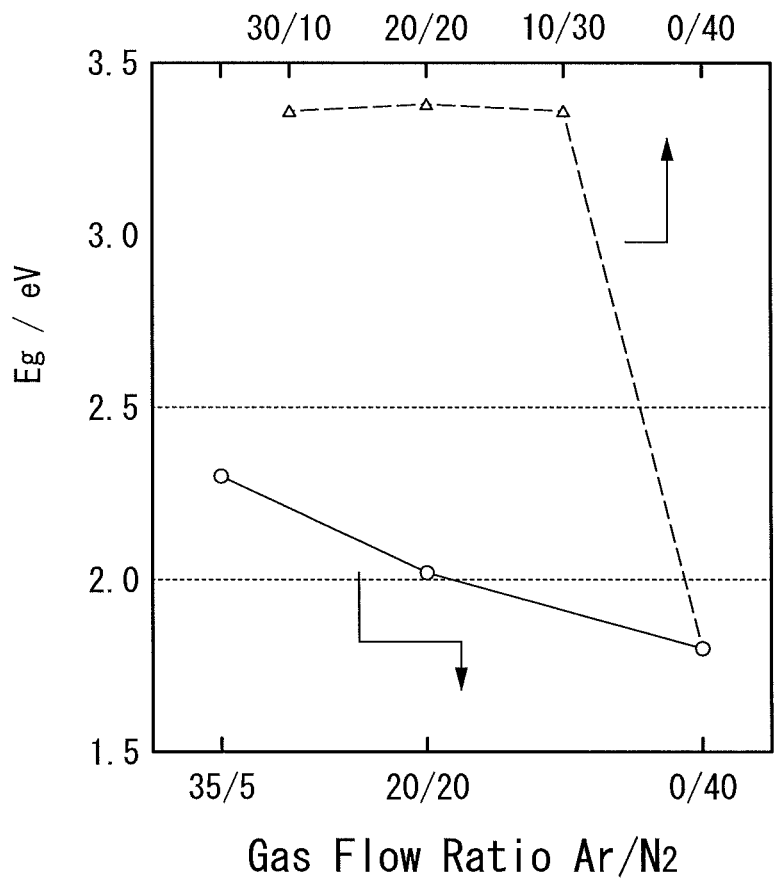
Figure 9:
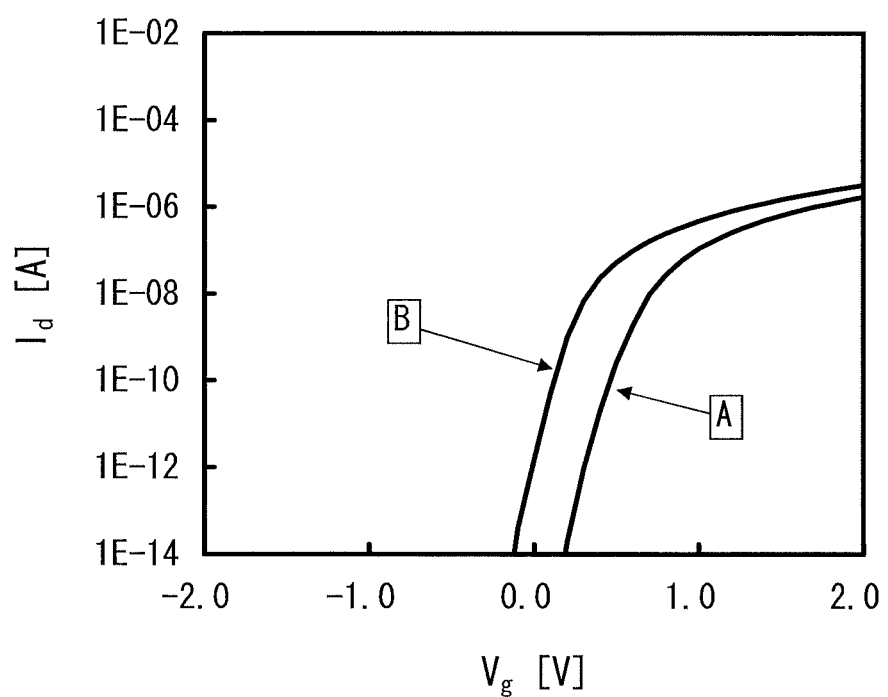
FIG. 9 illustrates an effect of one embodiment of the present invention.

FIGS. 7A to 7C are cross-sectional views illustrating a manufacturing process of a display device of this embodiment. A transistor described in this embodiment is a bottom-gate transistor. In addition, the transistor described in this embodiment is a bottom-contact transistor whose source electrode and drain electrode are in contact with a lower surface of a semiconductor film.

The outline of a manufacturing process will be described below. Note that for the structures denoted by the same reference numerals as those in Embodiment 4, a material, a means, a condition, and the like described in Embodiment 4 may be used as those in this embodiment unless otherwise specified. As illustrated in FIG. 7A, the first gate film 214, the second gate film 215, and the gate insulating film 212 are formed over the substrate 200 having an insulating surface.

After that, a conductive film such as a metal film is deposited and processed to have a desired shape, so that the source electrode 208a and the drain electrode 208b are formed as illustrated in FIG. 7B. Further, the oxide semiconductor film 206 is formed thereover.

As illustrated in FIG. 7C, the first insulator 209 and the second insulator 210 having a flat surface are formed. Then, the first insulator 209 and the second insulator 210 are selectively etched, so that a contact hole reaching the drain electrode 208b is formed. The display electrode 211 which is in contact with the drain electrode 208b through this contact hole is formed.

The difference between the transistor described in this embodiment and that described in Embodiment 4 is only positional relation between the oxide semiconductor film 206, and the source electrode 208a and the drain electrode 208b.

(Embodiment 6)

A semiconductor device which is one embodiment of the present invention can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices each including the semiconductor device described in the above embodiment are described.

Figure 10A:
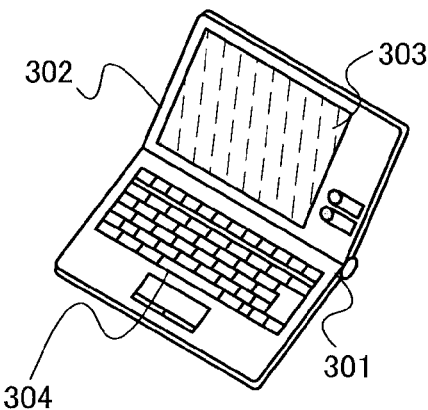
FIGS. 10A to 10F each illustrate an application example of the present invention.

FIG. 10A illustrates a laptop personal computer, which includes a main body 301, a housing 302, a display portion 303, a keyboard 304, and the like. By applying the semiconductor device described in any of Embodiments 1 to 5, the laptop personal computer can have high reliability.

Figure 10B:
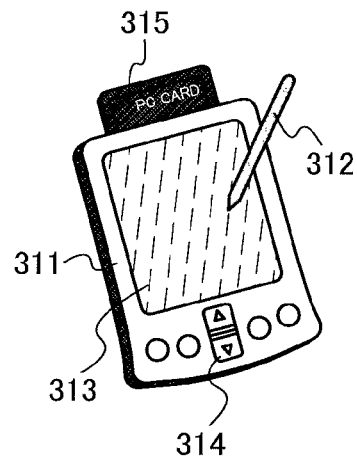

FIG. 10B illustrates a portable information terminal (PDA) which includes a display portion 313, an external interface 315, an operation button 314, and the like in a main body 311. A stylus 312 is included as an accessory for operation. By applying the semiconductor device described in any of Embodiments 1 to 5, the portable information terminal (PDA) can have higher reliability.

Figure 10C:
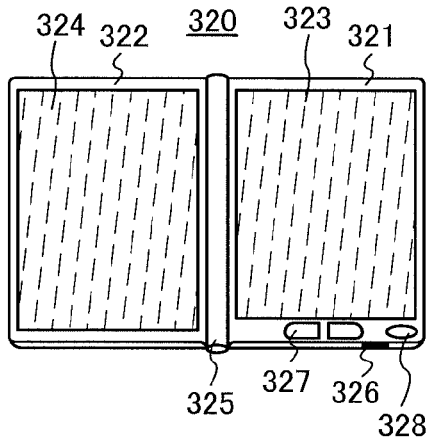

FIG. 10C illustrates an example of an e-book reader. For example, an e-book reader 320 includes two housings, a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 and a display portion 324 are incorporated in the housing 321 and the housing 322, respectively. The display portion 323 and the display portion 324 may display one image or different images. When the display portion 323 and the display portion 324 display different images, for example, text can be displayed on a display portion on the right side (the display portion 323 in FIG. 10C) and graphics can be displayed on a display portion on the left side (the display portion 324 in FIG. 10C). By applying the semiconductor device described in any of Embodiments 1 to 5, the e-book reader can have high reliability.

FIG. 10C illustrates an example in which the housing 321 is provided with an operation portion and the like. For example, the housing 321 is provided with a power switch 326, operation keys 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Moreover, the e-book reader 320 may have a function of an electronic dictionary.

The e-book reader 320 may have a configuration capable of wirelessly transmitting and receiving data. Through wireless communication, desired book data or the like can be purchased and downloaded from an e-book server.

Figure 10D:
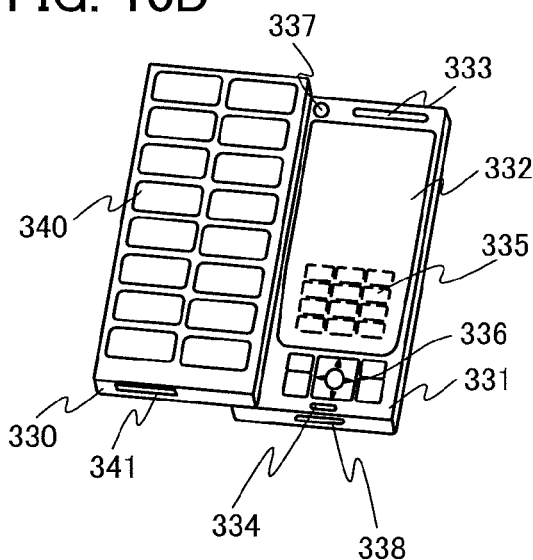

FIG. 10D illustrates a mobile phone, which includes two housings, a housing 330 and a housing 331. The housing 331 includes a display panel 332, a speaker 333, a microphone 334, a pointing device 336, a camera lens 337, an external connection terminal 338, and the like. In addition, the housing 330 includes a solar cell 340 having a function of charge of the portable information terminal, an external memory slot 341, and the like. Further, an antenna is incorporated in the housing 331. By applying the semiconductor device described in any of Embodiments 1 to 5, the mobile phone can have high reliability.

Further, the display panel 332 is provided with a touch panel. A plurality of operation keys 335 which are displayed as images is illustrated by dashed lines in FIG. 10D. Note that a boosting circuit by which a voltage output from the solar cell 340 is increased to be sufficiently high for each circuit is also included.

In the display panel 332, the display orientation can be changed as appropriate depending on a usage pattern. Further, the mobile phone is provided with the camera lens 337 on the same surface as the display panel 332, and thus it can be used as a video phone. The speaker 333 and the microphone 334 can be used for videophone calls, recording and playing sound, and the like as well as voice calls. Moreover, the housings 330 and 331 in a state where they are opened as illustrated in FIG. 10D can be slid so that one overlaps the other; therefore, the size of the mobile phone can be reduced, which makes the mobile phone suitable for being carried.

The external connection terminal 338 can be connected to an AC adapter and various types of cables such as a USB cable, and charging and data communication with a personal computer are possible. Moreover, a larger amount of data can be saved and moved by inserting a recording medium to the external memory slot 341.

Further, in addition to the above functions, an infrared communication function, a television reception function, or the like may be provided.

Figure 10E:
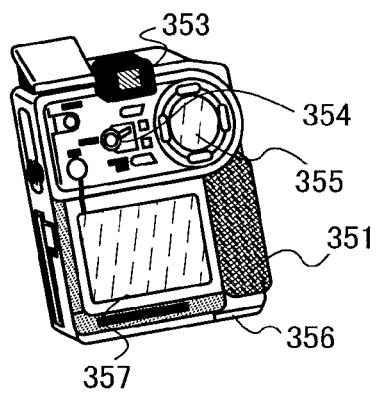

FIG. 10E illustrates a digital video camera which includes a main body 351, a display portion (A) 357, an eyepiece 353, an operation switch 354, a display portion (B) 355, a battery 356, and the like. By applying the semiconductor device described in any of Embodiments 1 to 5, the digital video camera can have high reliability.

Figure 10F:
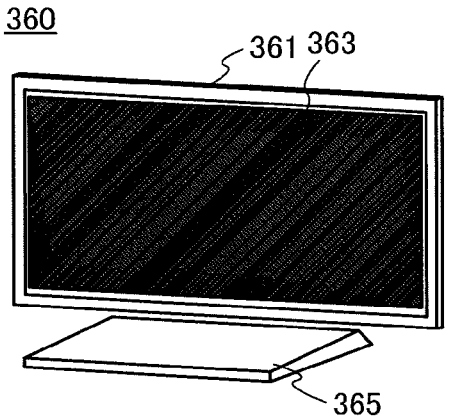

FIG. 10F illustrates an example of a television set. In a television set 360, a display portion 363 is incorporated in a housing 361. The display portion 363 can display images. Here, the housing 361 is supported by a stand 365. By applying the semiconductor device described in any of Embodiments 1 to 5, the television set 360 can have high reliability.

The television set 360 can be operated by an operation switch of the housing 361 or a separate remote controller. Further, the remote controller may be provided with a display portion for displaying data output from the remote controller.

Note that the television set 360 is provided with a receiver, a modem, and the like. With the use of the receiver, general television broadcasting can be received. Furthermore, when the television set is connected to a communication network with or without wires via the modem, one-way (from a sender to a receiver) or two-way (between a sender and a receiver or between receivers) information communication can be performed.

The structures, the methods, and the like described in this embodiment can be combined as appropriate with any of the structures, the methods, and the like described in the other embodiments.

This application is based on Japanese Patent Application serial no. 2010-235534 filed with Japan Patent Office on Oct. 20, 2010, the entire contents of which are hereby incorporated by reference.

What is claimed is:

1. A semiconductor device comprising:
an oxide semiconductor film comprising indium;
a first gate electrode comprising a compound conductor;
a second gate electrode in contact with the first gate electrode; and
an insulating film between the oxide semiconductor film and the first gate electrode,
wherein the compound conductor comprises indium and nitrogen,
wherein a band gap of the compound conductor is less than 2.8 eV, and
wherein a side edge of the first gate electrode is aligned with a side edge of the second gate electrode.

2. The semiconductor device according to claim 1, wherein a work function of the compound conductor is greater than or equal to 5 eV.

3. The semiconductor device according to claim 1, wherein an ionization potential of the compound conductor is greater than or equal to 7 eV.

4. The semiconductor device according to claim 1,
wherein a percentage of nitrogen in the compound conductor is greater than or equal to 10 at. % and less than or equal to 50 at. %, and
wherein a percentage of indium in the compound conductor is greater than or equal to 10 at. % and less than or equal to 50 at. %.

5. The semiconductor device according to claim 1, wherein a concentration of a donor or an acceptor in the oxide semiconductor film is lower than or equal to $1 \times 10^{12}$ cm$^{-3}$.

6. The semiconductor device according to claim 1,
wherein the oxide semiconductor film comprises a crystalline structure, and
wherein the oxide semiconductor film is provided over a surface with an average surface roughness of less than or equal to 1 nm.

7. A semiconductor device comprising:
an oxide semiconductor film comprising indium;
an insulating film over the oxide semiconductor film;
a first gate electrode comprising a compound conductor over the insulating film; and
a second gate electrode over and in contact with the first gate electrode,
wherein the compound conductor comprises indium and nitrogen,
wherein a band gap of the compound conductor is less than 2.8 eV, and
wherein a side edge of the first gate electrode is aligned with a side edge of the second gate electrode.

8. The semiconductor device according to claim 7, wherein a work function of the compound conductor is greater than or equal to 5 eV.

9. The semiconductor device according to claim 7, wherein an ionization potential of the compound conductor is greater than or equal to 7 eV.

10. The semiconductor device according to claim 7,
wherein a percentage of nitrogen in the compound conductor is greater than or equal to 10 at. % and less than or equal to 50 at. %, and
wherein a percentage of indium in the compound conductor is greater than or equal to 10 at. % and less than or equal to 50 at. %.

11. The semiconductor device according to claim 7, wherein a concentration of a donor or an acceptor in the oxide semiconductor film is lower than or equal to $1 \times 10^{12}$ cm$^{-3}$.

12. The semiconductor device according to claim 7,
wherein the oxide semiconductor film comprises a crystalline structure, and wherein the oxide semiconductor film is provided over a surface with an average surface roughness of less than or equal to 1 nm.

13. A semiconductor device comprising:
a first gate electrode;
a second gate electrode comprising a compound conductor;
an insulating film over the second gate electrode; and
an oxide semiconductor film comprising indium over the insulating film,
wherein the compound conductor comprises indium and nitrogen,
wherein a band gap of the compound conductor is less than 2.8 eV,
wherein the second gate electrode is provided over and in contact with the first gate electrode, and
wherein a side edge of the first gate electrode is aligned with a side edge of the second gate electrode.

14. The semiconductor device according to claim 13, wherein a work function of the compound conductor is greater than or equal to 5 eV.

15. The semiconductor device according to claim 13, wherein an ionization potential of the compound conductor is greater than or equal to 7 eV.

16. The semiconductor device according to claim 13,
wherein a percentage of nitrogen in the compound conductor is greater than or equal to 10 at. % and less than or equal to 50 at. %, and
wherein a percentage of indium in the compound conductor is greater than or equal to 10 at. % and less than or equal to 50 at. %.

17. The semiconductor device according to claim 13, wherein a concentration of a donor or an acceptor in the oxide semiconductor film is lower than or equal to $1 \times 10^{12}$ cm$^{-3}$.

18. The semiconductor device according to claim 13,
wherein the oxide semiconductor film comprises a crystalline structure, and
wherein the oxide semiconductor film is provided over a surface with an average surface roughness of less or equal to 1 nm.

19. A method for manufacturing a semiconductor device, comprising the steps of:
providing a first gate electrode;
providing a second gate electrode comprising a compound conductor over and in contact with the first gate electrode;
providing an insulating film over and in contact with the second gate electrode; and
providing an oxide semiconductor film comprising indium over the insulating film,
wherein the compound conductor comprises indium and nitrogen,
wherein a band gap of the compound conductor is less than 2.8 eV, and
wherein a side edge of the first gate electrode is aligned with a side edge of the second gate electrode.

20. The method for manufacturing a semiconductor device, according to claim 19, wherein the compound conductor is formed by a sputtering method in an atmosphere comprising nitrogen.

21. The method for manufacturing a semiconductor device, according to claim 19, wherein the compound conductor is formed by a sputtering method in an atmosphere comprising oxygen at lower than or equal to 5%.

22. The method for manufacturing a semiconductor device, according to claim 19,
wherein the oxide semiconductor film comprises a crystalline structure, and
wherein the oxide semiconductor film is provided over a surface with an average surface roughness of less than or equal to 1 nm.

23. A method for manufacturing a semiconductor device, comprising the steps of:
providing an oxide semiconductor film comprising indium;
providing an insulating film over the oxide semiconductor film;
providing a first gate electrode comprising a compound conductor over and in contact with the insulating film; and
providing a second gate electrode over and in contact with the first gate electrode,
wherein the compound conductor comprises indium and nitrogen,
wherein a band gap of the compound conductor is less than 2.8 eV, and
wherein a side edge of the first gate electrode is aligned with a side edge of the second gate electrode.

24. The method for manufacturing a semiconductor device, according to claim 23, wherein the compound conductor is formed by a sputtering method in an atmosphere comprising nitrogen.

25. The method for manufacturing a semiconductor device, according to claim 23, wherein the compound conductor is formed by a sputtering method in an atmosphere comprising oxygen at lower than or equal to 5%.

26. The method for manufacturing a semiconductor device, according to claim 23,
wherein the oxide semiconductor film comprises a crystalline structure, and
wherein the oxide semiconductor film is provided over a surface with an average surface roughness of less than or equal to 1 nm.

* * * * *

UNITED STATES PATENT AND TRADEMARK OFFICE
CERTIFICATE OF CORRECTION

PATENT NO. : 8,546,892 B2  
APPLICATION NO. : 13/274512  
DATED : October 1, 2013  
INVENTOR(S) : Yuki Imoto et al.

It is certified that error appears in the above-identified patent and that said Letters Patent is hereby corrected as shown below:

In the Specification

Column 9, line 8, replace "$(x_2, Y_1)$" with --$(x_2, y_1)$--;

Column 11, line 11, replace "an" with --film--;

Column 11, line 40, replace "faulted" with --formed--;

Column 12, line 16, after "$1 \times 10^{15}$" replace "$cm^3$" with --$cm^{-3}$--;

Column 18, line 22, replace "fanned" with --formed--;

In the Claims

Column 23, line 39, in claim 18 after "less" insert --than--.

Signed and Sealed this  
Eleventh Day of March, 2014

Michelle K. Lee  
*Deputy Director of the United States Patent and Trademark Office*